US009536976B2

(12) United States Patent
Chen et al.

(10) Patent No.: US 9,536,976 B2
(45) Date of Patent: Jan. 3, 2017

(54) TRENCH SCHOTTKY RECTIFIER DEVICE AND METHOD FOR MANUFACTURING THE SAME

(71) Applicant: PFC Device Holdings Ltd, Hong Kong (CN)

(72) Inventors: Mei-Ling Chen, New Taipei (TW); Hung-Hsin Kuo, New Taipei (TW)

(73) Assignee: PFC DEVICE HOLDINGS LTD, Hong Kong (CN)

( * ) Notice: Subject to any disclaimer, the term of this patent is extended or adjusted under 35 U.S.C. 154(b) by 0 days.

(21) Appl. No.: 14/940,719

(22) Filed: Nov. 13, 2015

(65) Prior Publication Data
US 2016/0071950 A1 Mar. 10, 2016

Related U.S. Application Data

(62) Division of application No. 14/526,581, filed on Oct. 29, 2014, now Pat. No. 9,219,170, and a division of
(Continued)

(30) Foreign Application Priority Data

Oct. 12, 2009 (TW) ............................... 98134527 A

(51) Int. Cl.
*H01L 21/425* (2006.01)
*H01L 29/66* (2006.01)
(Continued)

(52) U.S. Cl.
CPC ..... *H01L 29/66143* (2013.01); *H01L 21/2256* (2013.01); *H01L 21/28537* (2013.01); *H01L 29/402* (2013.01); *H01L 29/872* (2013.01)

(58) Field of Classification Search
CPC ........... H01L 21/2256; H01L 21/28537; H01L 29/402; H01L 29/66143; H01L 29/872
(Continued)

(56) References Cited

U.S. PATENT DOCUMENTS

| 4,835,586 A | * | 5/1989 | Cogan | ............... H01L 29/66484 257/136 |
| 5,327,374 A | * | 7/1994 | Krautschneider | ...... G11C 5/005 257/300 |

(Continued)

FOREIGN PATENT DOCUMENTS

TW    I221033    9/2004
TW    200921792  5/2009

OTHER PUBLICATIONS

Taiwan Intellectual Property Office, "Office Action", Feb. 25, 2013, Taiwan.
(Continued)

*Primary Examiner* — Mohammed Shamsuzzaman
(74) *Attorney, Agent, or Firm* — WPAT, PC; Justin King

(57) ABSTRACT

A method for fabricating a trench Schottky rectifier device is provided. At first, a plurality of trenched are formed in a substrate of a first conductivity type. An insulating layer is formed on sidewalls of the trenches. Then, an ion implantation procedure is performed through the trenches to form a plurality of doped regions of a second conductivity type under the trenches. Subsequently, the trenches are filled with conductive structure such as poly-silicon structure or tungsten structure. At last, an electrode overlying the conductive structure and the substrate is formed. Thus, a Schottky contact appears between the electrode and the substrate. Each doped region and the substrate will form a PN junction to pinch off current flowing toward the Schottky contact to suppress the current leakage in a reverse bias mode.

6 Claims, 12 Drawing Sheets

Related U.S. Application Data application No. 14/080,904, filed on Nov. 15, 2013, now Pat. No. 8,890,279, and a division of application No. 12/902,402, filed on Oct. 12, 2010, now Pat. No. 8,618,626.

(51) Int. Cl.
  *H01L 29/40* (2006.01)
  *H01L 29/872* (2006.01)
  *H01L 21/225* (2006.01)
  *H01L 21/285* (2006.01)

(58) Field of Classification Search
  USPC ... 257/212, 263, 4, 368, 330, 332, 147, 484; 438/488, 237, 582, 221, 532, 524
  See application file for complete search history.

(56) References Cited

U.S. PATENT DOCUMENTS

| | | | | |
|---|---|---|---|---|
| 6,252,258 | B1 * | 6/2001 | Chang | H01L 29/0623 257/119 |
| 6,309,929 | B1 * | 10/2001 | Hsu | H01L 29/0661 257/496 |
| 6,404,033 | B1 | 6/2002 | Chang et al. | |
| 6,580,141 | B2 | 6/2003 | Hshieh et al. | |
| 6,710,418 | B1 | 3/2004 | Sapp | |
| 6,770,548 | B2 | 8/2004 | Hshieh et al. | |
| 7,186,609 | B2 * | 3/2007 | Korec | H01L 27/0817 257/510 |
| 7,491,633 | B2 * | 2/2009 | Wu | H01L 29/66143 257/330 |
| 7,750,412 | B2 * | 7/2010 | Rinehimer | H01L 27/0727 257/371 |
| 7,932,536 | B2 * | 4/2011 | Hamerski | H01L 29/365 257/104 |
| 8,637,360 | B2 * | 1/2014 | Hebert | H01L 21/8258 257/77 |
| 8,664,701 | B2 * | 3/2014 | Chao | H01L 29/407 257/284 |
| 8,772,900 | B2 * | 7/2014 | Huang | H01L 29/872 257/471 |
| 2002/0125541 | A1 * | 9/2002 | Korec | H01L 27/0817 257/471 |
| 2005/0230744 | A1 * | 10/2005 | Wu | H01L 29/0623 257/330 |
| 2006/0131686 | A1 * | 6/2006 | Wu | H01L 27/0814 257/484 |
| 2006/0209887 | A1 * | 9/2006 | Bhalla | H01L 29/407 370/466 |
| 2007/0290234 | A1 * | 12/2007 | Wu | H01L 29/66143 257/212 |
| 2009/0072301 | A1 * | 3/2009 | Bhalla | H01L 29/407 257/328 |
| 2009/0127593 | A1 * | 5/2009 | Bhalla | H01L 29/1095 257/263 |
| 2009/0218619 | A1 * | 9/2009 | Hebert | H01L 29/0619 257/332 |
| 2009/0305475 | A1 * | 12/2009 | Hshieh | H01L 29/66727 438/237 |
| 2010/0032790 | A1 * | 2/2010 | Rinehimer | H01L 27/0727 257/475 |
| 2011/0073906 | A1 * | 3/2011 | Bobde | H01L 29/7806 257/147 |
| 2011/0312166 | A1 * | 12/2011 | Yedinak | H01L 21/3065 438/488 |
| 2011/0316076 | A1 * | 12/2011 | Lee | H01L 29/41766 257/332 |
| 2012/0037982 | A1 * | 2/2012 | Yedinak | H01L 29/36 257/330 |
| 2012/0049287 | A1 * | 3/2012 | Chen | H01L 29/66136 257/368 |
| 2013/0122695 | A1 * | 5/2013 | Chao | H01L 29/404 438/532 |
| 2013/0140630 | A1 * | 6/2013 | Chen | H01L 29/7827 257/330 |
| 2014/0131793 | A1 * | 5/2014 | Chao | H01L 29/407 257/331 |

OTHER PUBLICATIONS

State Intellectual Property Office of the People's Republic of China, "Office Action", Mar. 18, 2011, China.

\* cited by examiner

TRENCH SCHOTTKY RECTIFIER DEVICE AND METHOD FOR MANUFACTURING THE SAME

This is a divisional application of co-pending U.S. application Ser. No. 14/526,581, filed Oct. 29, 2014, which is a divisional of U.S. Pat. No. 8,890,279, filed Nov. 15, 2013, which is a divisional of U.S. Pat. No. 8,618,626, filed Oct. 12, 2010, which claims the benefit of Taiwan application 98134527, filed on Oct. 12, 2009. The subject matters of which are incorporated herein by reference.

FIELD OF THE INVENTION

The present invention relates to a trench Schottky rectifier device and related manufacturing method, and more particularly to a trench Schottky rectifier device with embedded doped regions.

BACKGROUND OF THE INVENTION

A Schottky diode is a unipolar device using electrons as carriers, which is characterized by high switching speed and low forward voltage drop. However, the Schottky diodes have limitation of relatively high reverse leakage current. The characteristics of the Schottky barrier are determined by the metal work function of the metal electrode, the band gap of the intrinsic semiconductor, the type and concentration of dopants in the semiconductor layer, and other factors. In contrast to the Schottky diode, a PN junction diode is a bipolar device that can pass more current than the Schottky diode. However, the PN junction diode has a forward voltage drop higher than that of the Schottky diode, and takes longer reverse recovery time due to a slow and random recombination of electrons and holes during the recovery period.

A Schottky rectifier device has been described in U.S. Pat. No. 6,710,418 to overcome the current leakage problem. Please refer to FIG. 1, a schematic diagram illustrating the Schottky rectifier device with insulation-filled trenches. The Schottky rectifier device 100 includes a heavily-doped N-type substrate 102, a lightly-doped N-type epitaxial layer 104 overlying the substrate 102, and a plurality of insulation-filled trenches 114 extending from the top surface of the epitaxial layer 104. There are two P-type silicon strips 108 on sidewalls of each trench 114. An anode electrode 110 is provided on the top surface of the epitaxial layer 104 and a cathode electrode 116 is provided on the bottom surface of the substrate 102. The anode electrode 110 forms a Schottky contact with the underlying epitaxial layer 104, and is in contact with the P-type silicon strips 108.

In the Schottky rectifier device 100, the Schottky contact between the anode electrode 110 and the epitaxial layer 104 results in low forward voltage drop. Furthermore, the P-type strips 108 can prevent the low accumulation threshold to reduce the current leakage problem of the Schottky rectifier device 100. However, the P-type strips 108 occupy some areas of the Schottky contact, and thus the size of the Schottky rectifier device 100 should be enlarged to keep the equivalent area of the Schottky contact to prevent increasing the forward voltage drop and consuming more power. Therefore, an improved Schottky rectifier device with low current leakage but without increasing the size thereof is desired. There is a need of providing the improved Schottky rectifier device in order to obviate the drawbacks encountered from the prior art.

SUMMARY OF THE INVENTION

The present invention provides a trench Schottky rectifier device having low forward voltage drop and low reverse leakage current.

The present invention also provides a method for manufacturing a trench Schottky rectifier device having low forward voltage drop and low reverse leakage current.

In accordance with an aspect of the present invention, the trench Schottky rectifier device includes a substrate of a first conductivity type; a plurality of trenches formed in the substrate; and an insulating layer formed on sidewalls of the trenches. The trenches are filled with conductive structure. An electrode overlies the conductive structure and the substrate to form a Schottky contact between the electrode and the substrate. There are a plurality of doped regions of a second conductivity type formed in the substrate and located under the trenches. Each doped region and the substrate will form a PN junction to pinch off current flowing toward the Schottky contact in a reverse bias mode.

In accordance with another aspect of the present invention, a method for fabricating a trench Schottky rectifier device is provided. At first, a plurality of trenched are formed in a substrate of a first conductivity type. An insulating layer is formed on sidewalls of the trenches. Then, an ion implantation procedure is performed through the trenches to form a plurality of doped regions of a second conductivity type under the trenches. Subsequently, the trenches are filled with conductive structure such as polysilicon structure or tungsten structure. At last, an electrode overlying the conductive structure and the substrate is formed. Thus, a Schottky contact appears between the electrode and the substrate. Each doped region and the substrate will form a PN junction to pinch off current flowing toward the Schottky contact to suppress the current leakage in a reverse bias mode.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
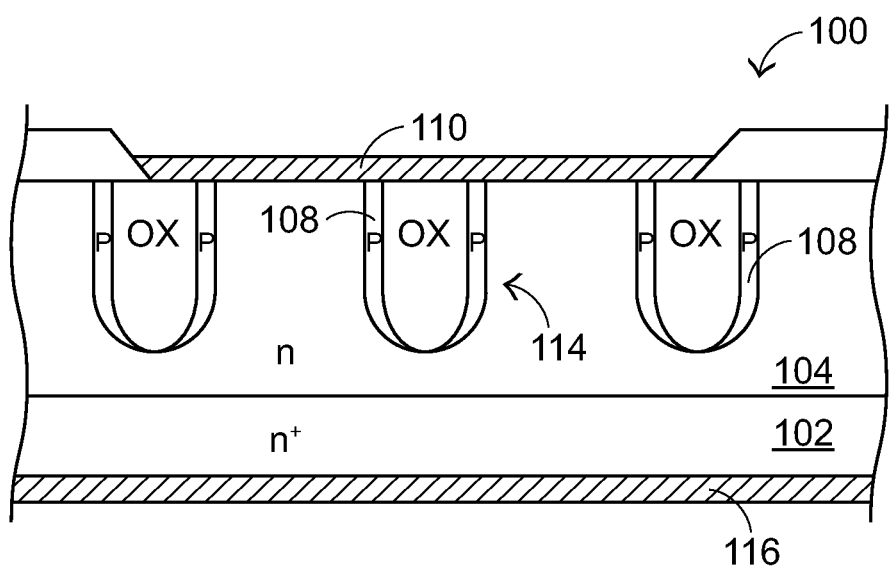
FIG. 1 (prior art) is a cross-sectional view schematically illustrating the conventional Schottky rectifier device.
Figure 2:
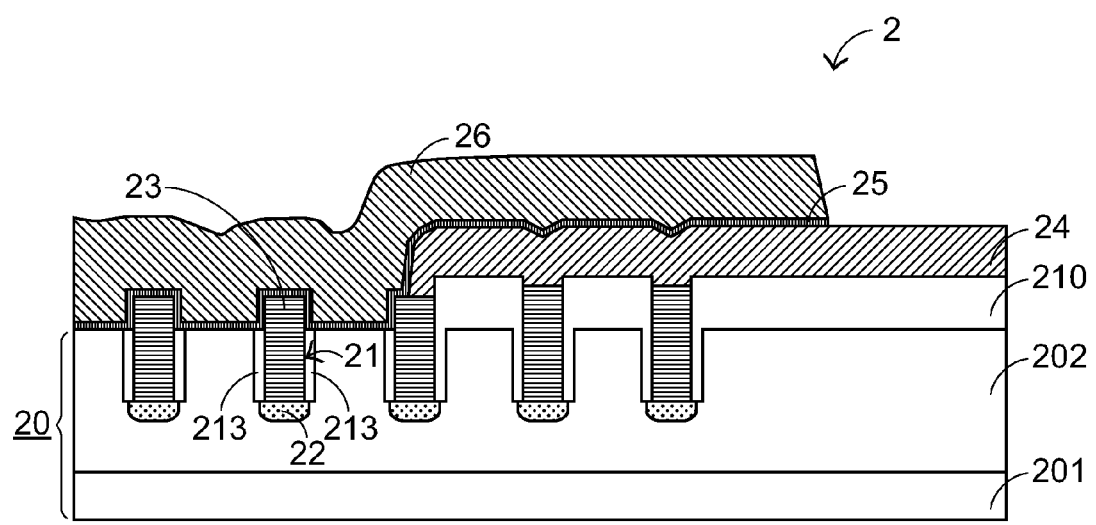
FIG. 2 is a cross-sectional view illustrating a preferred embodiment of a trench Schottky rectifier device according to the present invention.

Please to FIG. 2, a cross-sectional view illustrating a preferred embodiment of a trench Schottky rectifier device according to the present invention. Please note that the article "a" or "an" may be used for some elements, but the number of the elements is not limited to "one". The amount may vary with different applications. As shown in FIG. 2, the trench Schottky rectifier device 2 includes a substrate 20, a plurality of trenches 21, doped regions 22, polysilicon structure 23, oxide layers 210, 213, 24, an adhesion layer and an electrode 26. The substrate 20 includes a heavily-doped N-type silicon layer 201 and a lightly-doped N-type epitaxial layer 202. The plurality of trenches 21 are formed in the epitaxial layer 202 and extending from the top surface of the epitaxial layer 202. The sidewalls of the trenches 21 are covered with the oxide layers 213 and the trenches 21 are filled with the polysilicon structure 23 which protrudes from the top surface of the epitaxial layer 202. The doped regions 22 of P-type conductivity are formed in the epitaxial layer 202 and located under the trenches 21, and in contact with the polysilicon structure 23 at bottoms of the trenches 21.

An isolation layer including the oxide layers 210 and 24 is provided to cover a portion of the epitaxial layer 202 at an inactive area of the trench Schottky rectifier device 2 and separate the trench Schottky rectifier device 2 from other devices. The electrode 26 is provided on the oxide layer 24, the exposed epitaxial layer 202, and the protruding polysilicon structure 23. The electrode 26 is made of metal material, for example Al, Al alloy or other suitable metal material. An adhesion layer 25 made of Ti or TiN may be provided between the electrode 26 and the substrate 20 to enhance the bonding of the electrode 26 to the substrate 20. According to the described structure, Schottky contacts are formed on the interface between the metal electrode 26 (or the adhesion layer 25) and the epitaxial layer 202.

In a forward bias mode, the Schottky contacts between the metal layer 25 and the epitaxial layer 202 bring low forward voltage drop and consume less power. Furthermore, the P-type doped regions 22 and the lightly-doped N-type epitaxial layer 202 form PN junctions. In a reverse bias mode, depletion regions of the PN junctions are widened and the carrier density therein is very small. Hence, the widened depletion regions of neighboring PN junctions will hinder and pinch off the current flow under the Schottky contacts. Based on the pinch-off effect, the reverse current leakage is thus suppressed. It is to be noted that the P-type doped regions 22 are located under the trenches 21 and do not occupy the area of the Schottky contacts. Hence, it is not necessary to enlarge the size of the trench Schottky rectifier device 2 to compensate for the reduced area of the Schottky contacts.

Figure 3A:
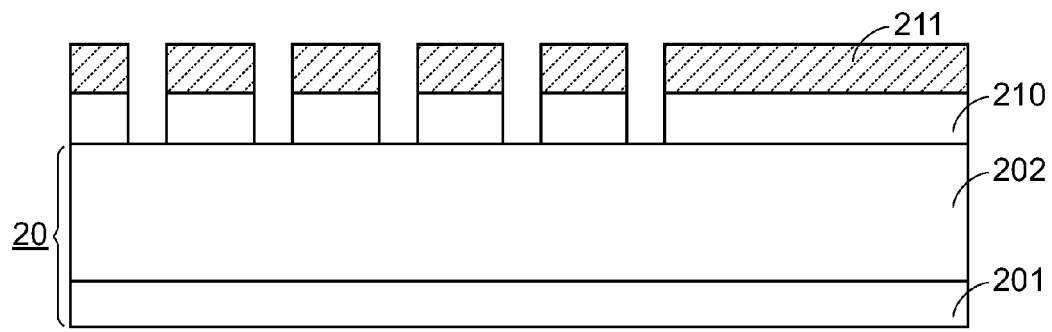
FIGS. 3A-3H schematically illustrate the manufacturing method for forming the trench Schottky rectifier device of FIG. 2.

FIGS. 3A-3H illustrate a manufacturing method for forming the trench Schottky rectifier device of FIG. 2 according to the present invention. As shown in FIG. 3A, a stack structure including a substrate 20, a mask oxide layer 210 and a first patterned photoresist layer 211 with a trench pattern is provided. The substrate 20 includes a heavily-doped N-type silicon layer 201 and a lightly-doped N-type epitaxial layer 202. The mask oxide layer 210 on the substrate 20 is grown by thermal oxidation or deposition. The mask oxide layer 210 is then subjected to an etching step to partially remove the mask oxide layer 210 to expose a portion of the lightly-doped N-type epitaxial layer 202 according to the trench pattern.

Figure 3B:
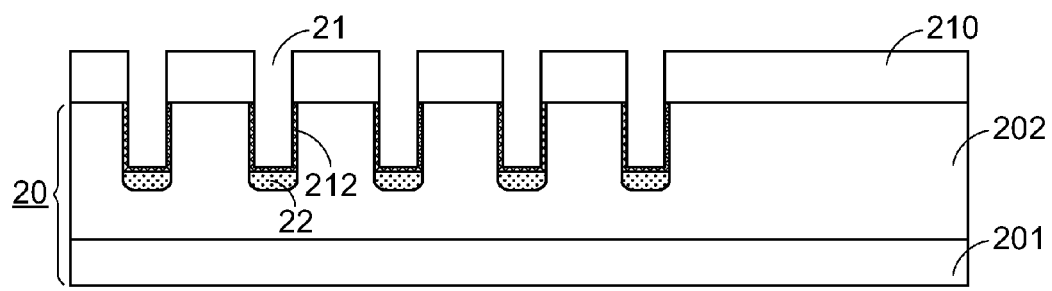

In FIG. 3B, the first patterned photoresist layer 211 is stripped off. Then, the epitaxial layer 202 is etched through openings of the mask oxide layer 210 to form the trenches 21 in the epitaxial layer 202. An $O_2$ based thermal procedure is performed to form a thin sacrificial oxide layers 212 on sidewalls and bottoms of the trenches 21. P-type dopants such as B ions or $BF_2$ are then implanted into the epitaxial layer 202 through the bottoms of the trenches 21 to form the doped regions 22 under the trenches 21. The doped regions 22 play an important role in suppressing the leakage current as described above.

Figure 3C:
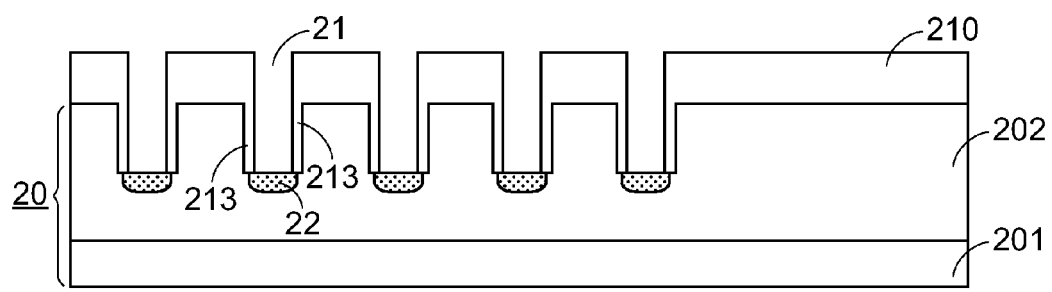

In FIG. 3C, the thin sacrificial oxide layer 212 has been removed and gate oxide layers (insulating layers) 213 are formed to cover the sidewalls and the bottoms of the trenches 21. It is to be noted that after removing the thin sacrificial oxide layers 212, the smoothness of the surfaces of the trenches 21 are improved. The oxide layers 213 on the bottoms of the trenches 21 are further etched off to expose the doped regions 22.

Figure 3D:
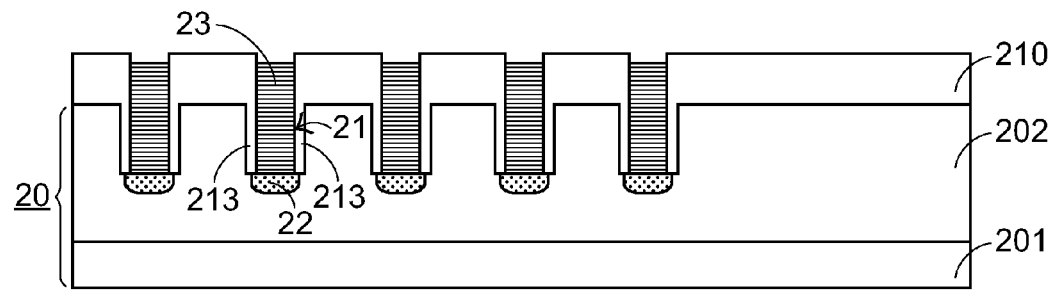

FIG. 3D shows that the trenches 21 are filled with a polysilicon structure 23. In an embodiment, a polysilicon layer is first grown to cover the structure of FIG. 3C by a chemical vapor deposition (CVD) procedure, and then the polysilicon layer is subjected to an etch-back procedure to remove a portion of the polysilicon layer out of the trenches 21. It is to be noted that the polysilicon structure 23 may be a polysilicon layer with or without dopants. If an ion implantation procedure is performed after the formation of the polysilicon layer to introduce dopants such as B ions into the polysilicon layer, a thermal drive-in step or an annealing step is optionally performed to allow better diffusion of the dopants or activate the dopants.

Figure 3E:
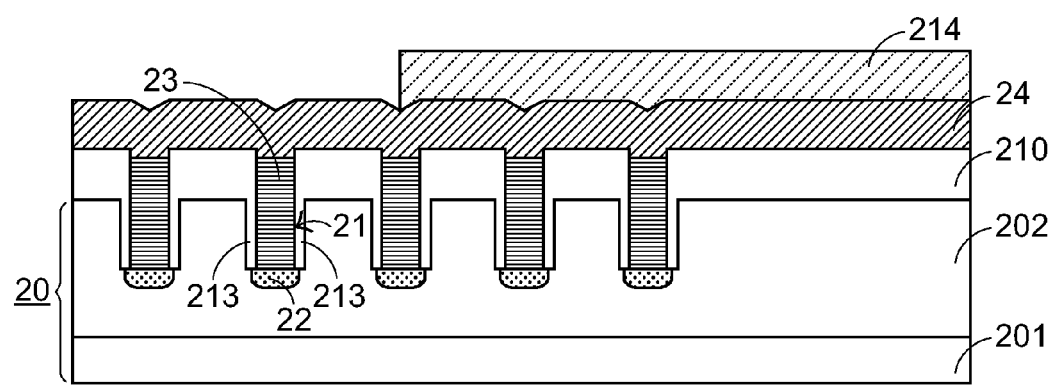
Figure 3F:
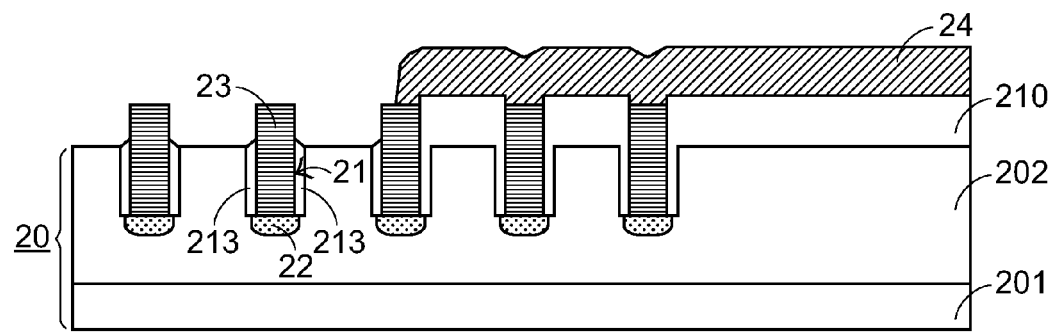
Figure 3G:
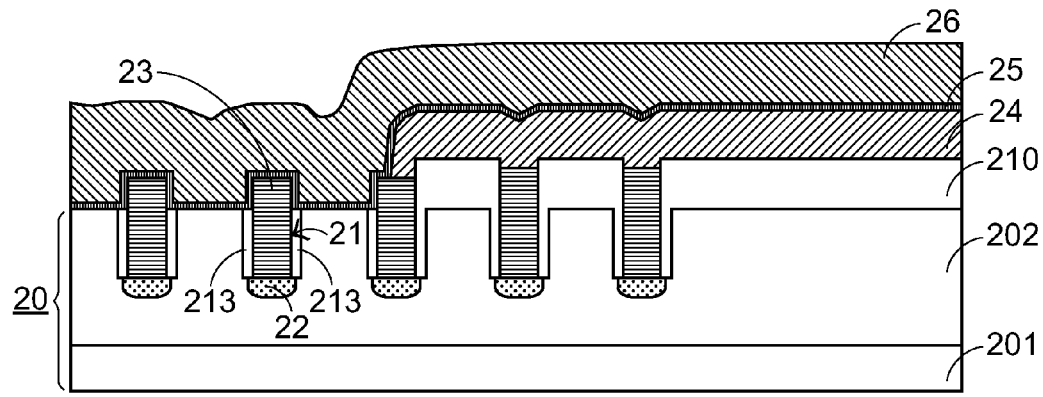
Figure 3H:
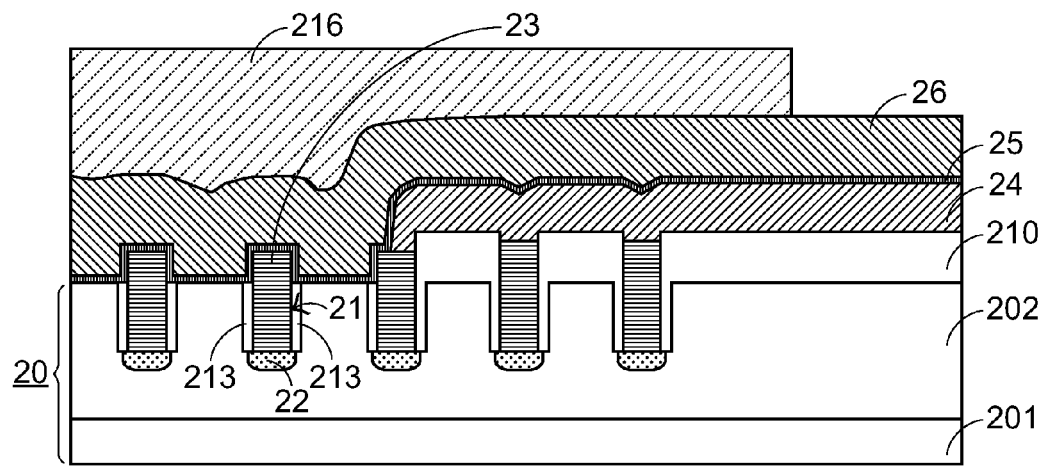

In FIG. 3E, an oxide layer 24 and a second patterned photoresist layer 214 defining the device area of the trench Schottky rectifier device 2 are sequentially formed on the structure of FIG. 3D. The oxide layer 24, for example, is formed from tetraethyl orthosilicate (TEOS) by a low pressure CVD (LPCVD) procedure with high deposition rate. Then, the oxide layers 24 and 210 are partially etched according to the second patterned photoresist layer 214 to expose portions of the top surface of the epitaxial layer 202 and the polysilicon structure 23. FIG. 3F shows the obtained structure in which the second patterned photoresist layer 214 has been stripped off, the resultant structure is obtained as shown in FIG. 3F. The combination of the oxide layers 210 and 24 may be considered as an isolation layer covering the inactive area of the trench Schottky rectifier device 2 to separate the trench Schottky rectifier device 2 from other devices.

At last, the electrode 26 is formed on the obtained structure. The adhesion layer 25 may be formed prior to the formation of the electrode 26 to enhance the bonding of the electrode 26 to the substrate 20. The electrode 26 and the adhesion layer 25 may be formed, but not limited to, as follows. At first, a metal sputtering procedure is performed on the structure of FIG. 3G to form the adhesion layer 25. Therefore, the whole wafer is blanketed by the adhesion layer 25. In an embodiment, the adhesion layer 25 is made of Ti or TiN. Subsequently, another metal sputtering procedure is performed on the adhesion layer 25 to form the electrode metal layer 26 overlying the adhesion layer 25. In an embodiment, the electrode metal layer 26 is made of Al or Al alloy. A rapid thermal processing (RTP) procedure may be performed after the electrode metal layer 26 is formed, so as to correct the defects resulting from the metal sputtering procedure. Then, a third patterned photoresist layer 216 is formed over the electrode metal layer 26. Portions of the electrode metal layer and the adhesion layer 25 are etched off to form the electrode 26 according to the third patterned photoresist layer 216. After the third patterned photoresist layer 216 is stripped off, a sintering process may be performed to enhance adhesion of the metal layer 25 to the substrate 20, the polysilicon structure 23 and the oxide layer 24. It is to be noted that the sintering procedure may be performed after each metal sputtering process. The resultant structure of the trench Schottky rectifier device 2 has been described with reference to FIG. 2. Although there are trenches 21 and doped regions 22 in the inactive area of the trench Schottky rectifier device 2 of FIG. 2, they are not essential components according to the present invention.

Figure 4:
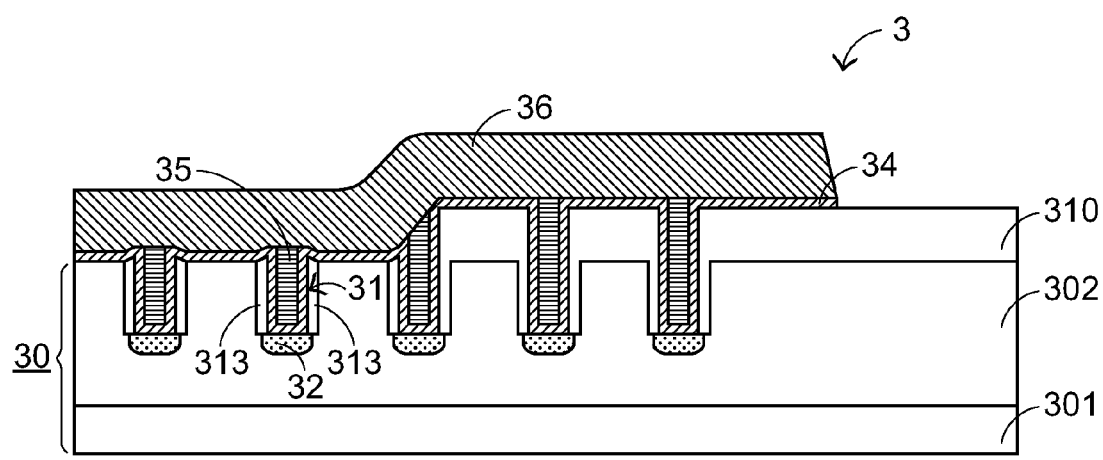
FIG. 4 is a cross-sectional view illustrating another preferred embodiment of a trench Schottky rectifier device according to the present invention.

FIG. 4 is a cross-sectional view illustrating another preferred embodiment of a trench Schottky rectifier device according to the present invention. The trench Schottky rectifier device 3 includes a substrate 30, a plurality of trenches 31, doped regions 32, metal structure 35, oxide layers 310, 313, an adhesion layer 34 and an electrode 36. The substrate 30 includes a heavily-doped N-type silicon layer 301 and a lightly-doped N-type epitaxial layer 302. The plurality of trenches 31 are formed in the epitaxial layer 302 and extending from the top surface of the epitaxial layer 302. The sidewalls of the trenches 31 are covered with the oxide layers 313 and the trenches 31 are filled with the metal structure 35. The metal structure 35 may be made of W or other suitable metal. The doped regions 32 of P-type conductivity are formed in the epitaxial layer 302 and located under the trenches 31. The bottoms of the metal structure 35 are in contact with the doped regions 32.

The oxide layer 310 is provided to cover an inactive area of the trench Schottky rectifier device 3 and separate the trench Schottky rectifier device 3 from other devices. An electrode 36 is provided on the oxide layer 310, the exposed epitaxial layer 302, and the metal structure 35. The electrode 36 is made of metal material, for example Al, Al alloy or other suitable metal material. An adhesion layer 34 made of Ti or TiN may be provided between the electrode 36 and the substrate 30 to enhance the bonding of the electrode 36 to the substrate 30. In particular, the adhesion layer 34 covers the epitaxial layer 302 and the oxide layers 310, 313. According to the described structure, Schottky contacts are formed on the interface between the metal electrode 36 (or the adhesion layer 34) and the epitaxial layer 302.

In a forward bias mode, the Schottky contacts between the metal layer 36 and the epitaxial layer 302 have advantage of less power consumption. Furthermore, PN junctions consisting of the P-type doped regions 32 and the lightly-doped N-type epitaxial layer 302 can hinder and pinch off the current flow under the Schottky contacts as explained with reference to FIG. 2. Based on the pinch-off effect, the reverse current leakage is thus suppressed. The embedded doped regions 32 do not narrow the Schottky contacts. Hence, it is not necessary to enlarge the size of the trench Schottky rectifier device 3 to compensate for the reduced area of the Schottky contacts.

Figure 5A:
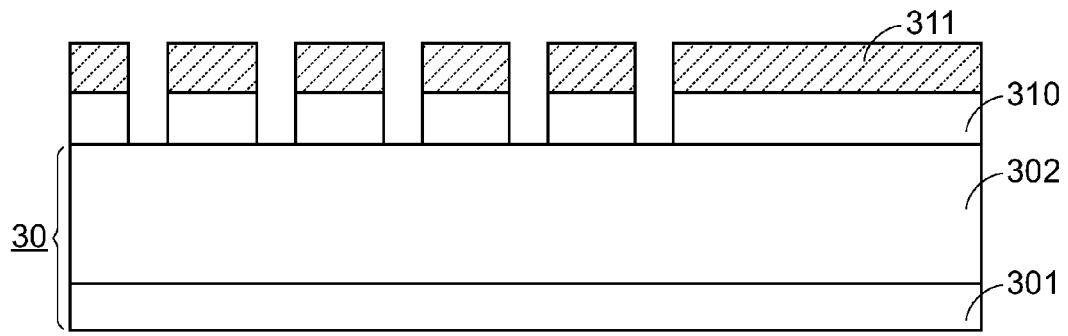
FIGS. 5A-5G schematically illustrate the manufacturing method for forming the trench Schottky rectifier device of FIG. 4.

FIGS. 5A-5G illustrate a manufacturing method for forming the trench Schottky rectifier device of FIG. 4 according to the present invention. As shown in FIG. 5A, a stack structure including a substrate 30, a mask oxide layer 310 and a first patterned photoresist layer 311 with a trench pattern is provided. The substrate 30 includes a heavily-doped N-type silicon layer 301 and a lightly-doped N-type epitaxial layer 302. The mask oxide layer 310 on the substrate 30 is grown by thermal oxidation or deposition. The mask oxide layer 310 is then subjected to an etching step to partially remove the mask oxide layer 310 to expose a portion of the lightly-doped N-type epitaxial layer 302 according to the trench pattern.

Figure 5B:
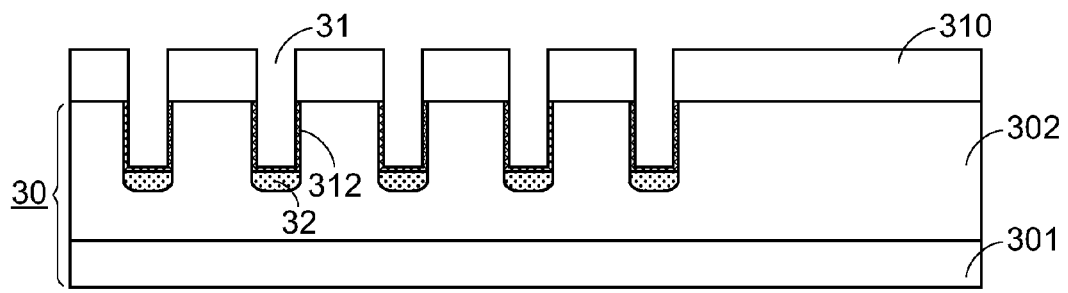

In FIG. 5B, the first patterned photoresist layer 311 is stripped off. Then, the epitaxial layer 302 is etched through openings of the mask oxide layer 310 to form the trenches 31 in the epitaxial layer 302. An $O_2$ based thermal procedure is performed to form thin sacrificial oxide layers 312 on sidewalls and bottoms of the trenches 31. P-type dopants such as B ions or $BF_2$ are then implanted into the epitaxial layer 302 through the bottoms of the trenches 31 to form the doped regions 32 under the trenches 31. The doped regions 32 and the epitaxial layer 302 will form PN junctions whose depletion regions can pinch off the leakage current in the reverse bias mode.

Figure 5C:
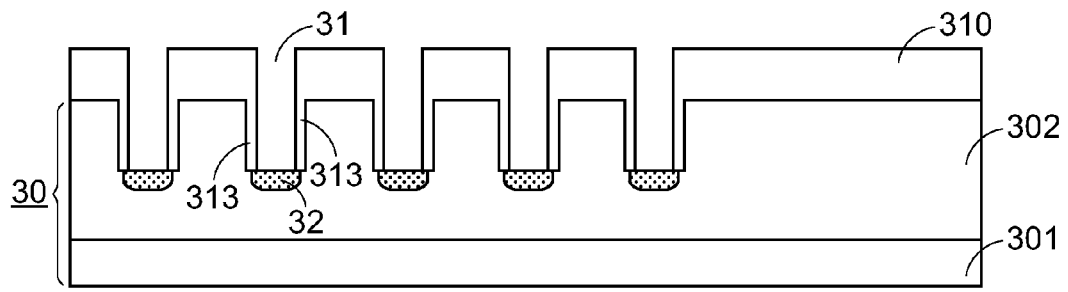

In FIG. 5C, the thin sacrificial oxide layers 312 has been removed and gate oxide layers (insulating layers) 313 are formed to cover the sidewalls and the bottoms of the trenches 31. The removal of the thin sacrificial oxide layers 312 improves the smoothness of the surfaces of the trenches 31. The oxide layers 313 on the bottoms of the trenches 31 are further etched off to expose the doped regions 32.

Figure 5D:
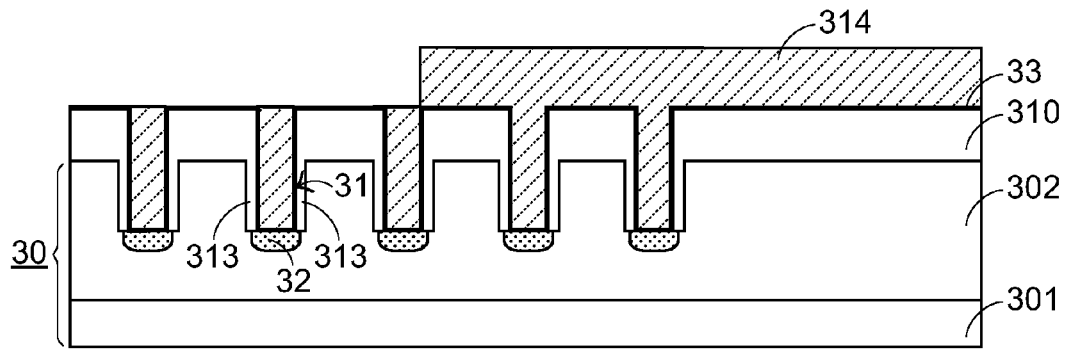
Figure 5E:
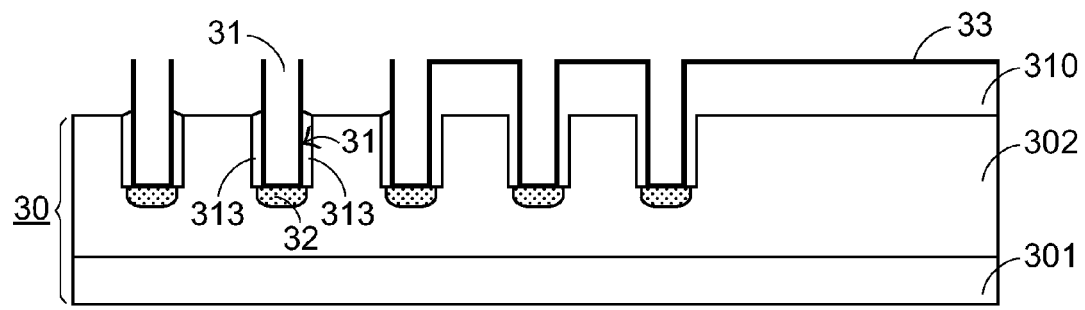

In FIG. 5D, a hard mask layer 33, for example a silicon nitride layer, is formed by a CVD procedure to cover the structure of FIG. 5C. A second patterned photoresist layer 314 for defining device area of the trench Schottky rectifier device 3 is formed on the hard mask layer 33 and in the trenches 31. Then, the uncovered hard mask layer 33 are removed by a dry etching step, and the exposed mask layer 310 is also removed by another dry etching step to expose the top surface of the epitaxial layer 302 at the device area. FIG. 5E shows the obtained structure in which the second patterned photoresist layer 314 has been stripped off.

Figure 5F:
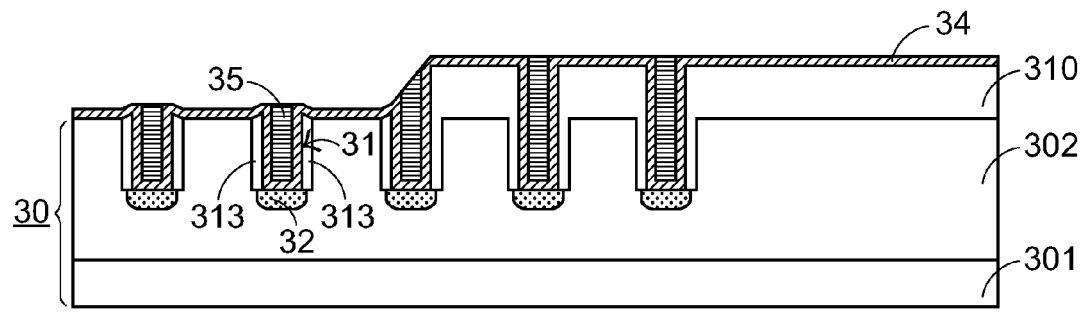

In FIG. 5F, the remaining hard mask layer 33 is removed, and an adhesion layer 34 made of Ti or TiN is optionally formed on the surfaces of the oxide layers 310 and 313 by a sputtering procedure to enhance the bonding of the electrode 36 to the epitaxial layer 302 and the oxide layers 310. The adhesion layer 34 may be subjected to a rapid thermal nitridation (RTN) process to enhance the bonding effect. Subsequently, the trenches 31 are filled with the metal structure 35, for example, made of W. In an embodiment, a metal layer such as a W layer is formed to cover the adhesion layer 34 by a CVD procedure, and then the metal layer is subjected to an etch-back procedure to remove a portion of the metal layer out of the trenches 31.

Figure 5G:
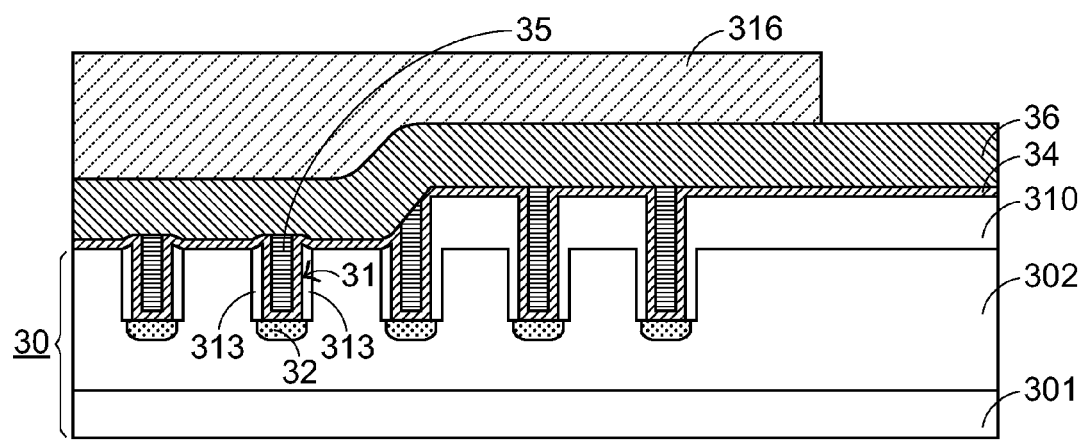

At last, the electrode 36 is formed on the obtained structure. In an embodiment, a metal sputtering procedure is performed on the structure of FIG. 5F to form the metal layer 36 overlying the adhesion layer 34 and the metal structure 35. In an embodiment, the metal layer 36 is made of Al or Al alloy. A rapid thermal processing (RTP) step can be performed after the metal layer 36 is formed, so as to correct the defects resulting from the metal sputtering procedure. Then, a third patterned photoresist layer 316 is formed over the metal layer 36 (FIG. 5G). Portions of the metal layer 36 and the adhesion layer 34 are etched off to form the electrode 36 according to the third patterned photoresist layer 316. After the third patterned photoresist layer 316 is stripped off, a sintering procedure may be performed to enhance adhesion of the metal layer 36 (and the adhesion layer 34) to the substrate 30, the metal structure 35 and the oxide layer 310. It is to be noted that the sintering procedure may be performed after each metal sputtering procedure. The resultant structure of the trench Schottky rectifier device 3 has been described with reference to FIG. 4. Similarly, the trenches 31 and doped regions 32 in the inactive area of the trench Schottky rectifier device 3 of FIG. 4 are not essential components according to the present invention.

Figure 6:
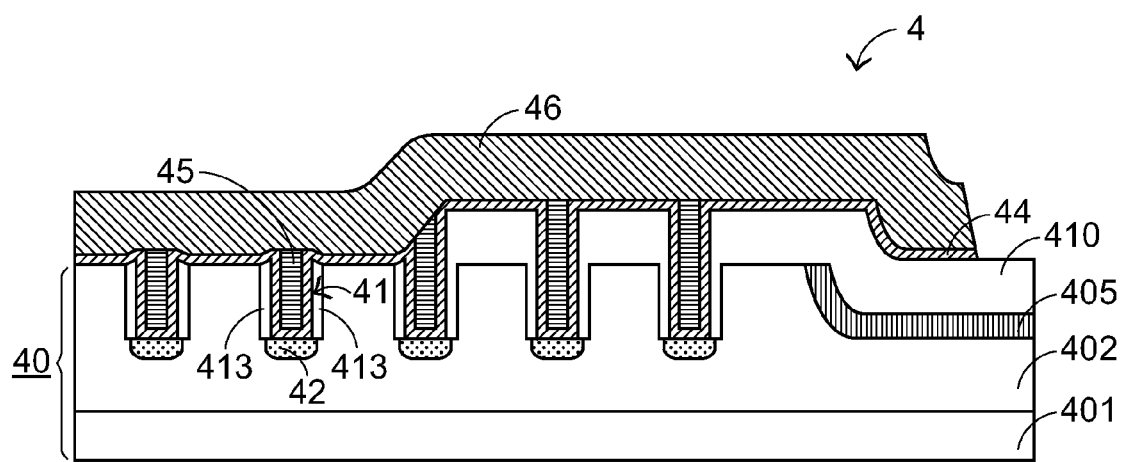
FIG. 6 is a cross-sectional view illustrating a further preferred embodiment of a trench Schottky rectifier device according to the present invention.

FIG. 6 is a cross-sectional view illustrating a further preferred embodiment of a trench Schottky rectifier device according to the present invention. Similar to the trench Schottky rectifier device 3 of FIG. 4, the trench Schottky rectifier device 4 includes a substrate 40 (including a heavily-doped N-type silicon layer 401 and a lightly-doped N-type epitaxial layer 402), a plurality of trenches 41, doped regions 42, metal structure 45, oxide layers 410, 413, an adhesion layer 44 and an electrode 46. The relevant components are not described verbosely again. In addition, the trench Schottky rectifier device 4 includes a guard ring 405 in the edge area of the substrate 40 for improving latchup immunity of the device and preventing interference between adjacent devices. The guard ring 405 may be of P-type conductivity when the substrate 40 is a N-type substrate.

In a forward bias mode, the trench Schottky rectifier device 4 has low forward voltage drop because of the Schottky contacts. Furthermore, in a reverse bias mode, the reverse current leakage is suppressed because of the widened depletion regions of the PN junctions consisting the P-type doped regions 42 and the N-Type epitaxial layer 402. It is to be noted that the P-type doped regions 42 are located under the trenches 41 and do not affect the area of the Schottky contacts.

Figure 7A:
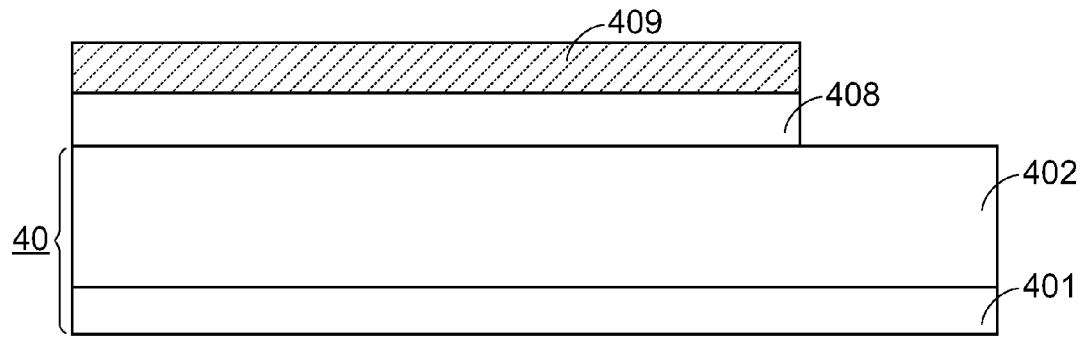
FIGS. 7A-7J schematically illustrate the manufacturing method for forming the trench Schottky rectifier device of FIG. 6.

FIGS. 7A-7H illustrate a manufacturing method for forming the trench Schottky rectifier device of FIG. 6 according to the present invention. As shown in FIG. 7A, a stack structure including a substrate 40, a mask layer 408 and a first patterned photoresist layer 409 defining the guard ring 405 is provided. The substrate 40 includes a heavily-doped N-type silicon layer 401 and a lightly-doped N-type epitaxial layer 402. The mask layer 408 on the substrate 40 is grown by thermal oxidation or deposition, and then subjected to an etching step to partially remove the mask layer 408 to expose a portion of the lightly-doped N-type epitaxial layer 402.

Figure 7B:
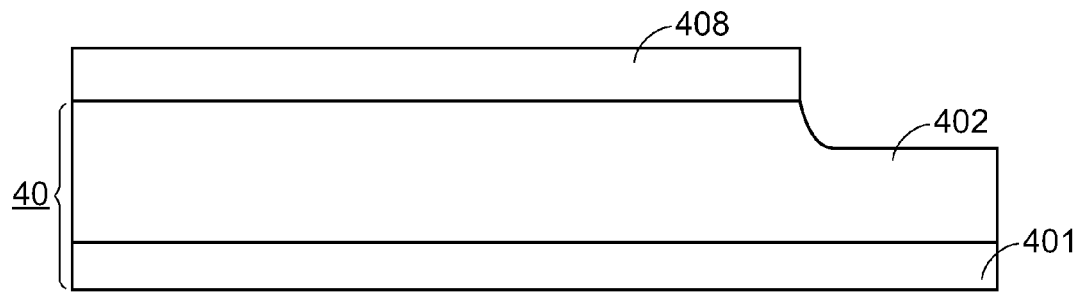
Figure 7C:
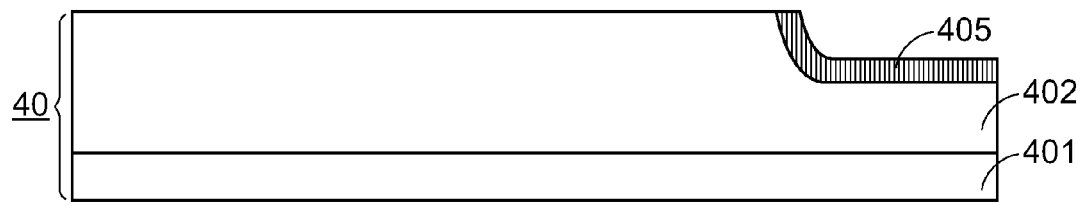

In FIG. 7B, the first patterned photoresist layer 409 has been stripped off. Then, an etching step is performed through the opening of the mask layer 408 to form a depression in the epitaxial layer 402. Subsequently, an ion implantation procedure is performed by using the remaining mask layer 408 as a mask to introduce dopants in to the edge area of the epitaxial layer 402, and thus the guard ring 405 is formed along the surface of the epitaxial layer 402 in the edge area. The dopants may include B ions or $BF_2$, and a thermal drive-in step or an annealing step is optionally performed to allow better diffusion of the dopants or activate the dopants. FIG. 7C shows the obtained structure in which the mask layer 408 has been removed.

Figure 7D:
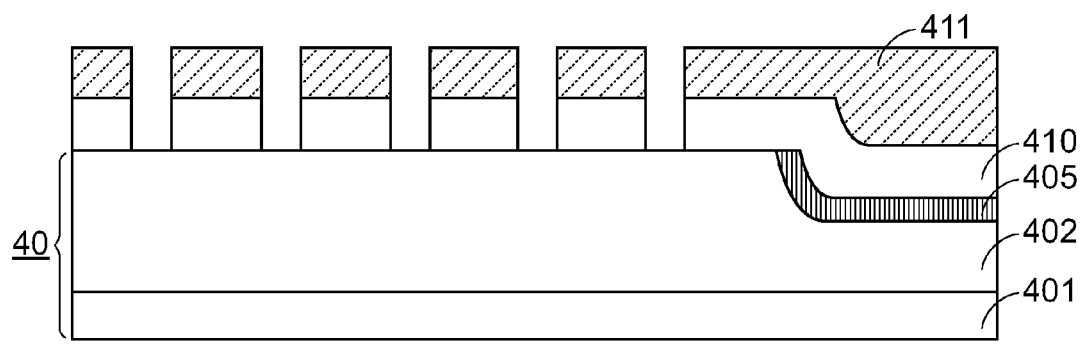

The subsequent steps are similar to those as described with reference to FIGS. 5A-5G. In FIG. 7D, the mask oxide layer 410 and a second patterned photoresist layer 411 with a trench pattern is provided. The mask oxide layer 410 is then subjected to an etching step to expose a portion of the lightly-doped N-type epitaxial layer 402 according to the trench pattern.

Figure 7E:
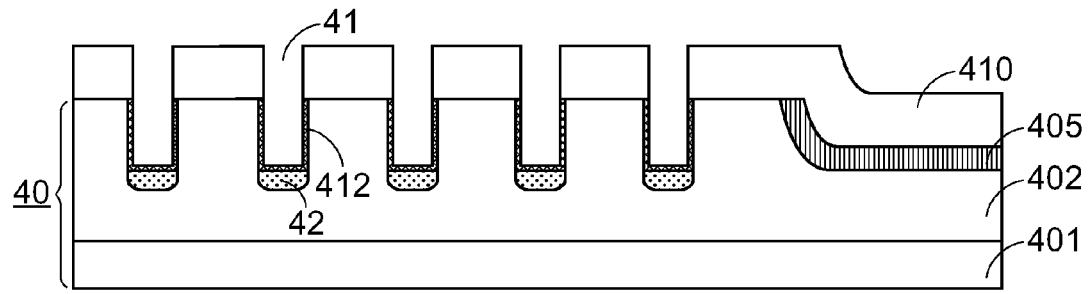

In FIG. 7E, the second patterned photoresist layer 411 is removed. Then, the epitaxial layer 402 is etched through openings of the mask oxide layer 410 to form the trenches 41 in the epitaxial layer 402. An $O_2$ based thermal procedure is performed to form the thin sacrificial oxide layer 412 on sidewalls and bottoms of the trenches 41. P-type dopants such as B ions or $BF_2$ are then implanted into the epitaxial layer 402 through the bottoms of the trenches 41 to form the doped regions 42 under the trenches 41. The doped regions 42 and the epitaxial layer 402 will form PN junctions whose depletion regions can pinch off the leakage current in the reverse bias mode.

Figure 7F:
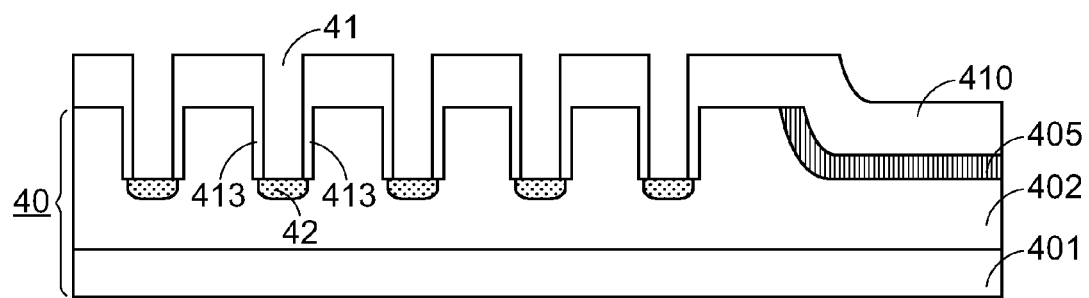

In FIG. 7F, the thin sacrificial oxide layer 412 has been removed to improve the smoothness of the surfaces of the trenches 41 and another oxide layers 413 are formed to cover the surfaces of the trenches 41. The oxide layers 413 on the bottoms of the trenches 41 are further etched off to expose the doped regions 42.

Figure 7G:
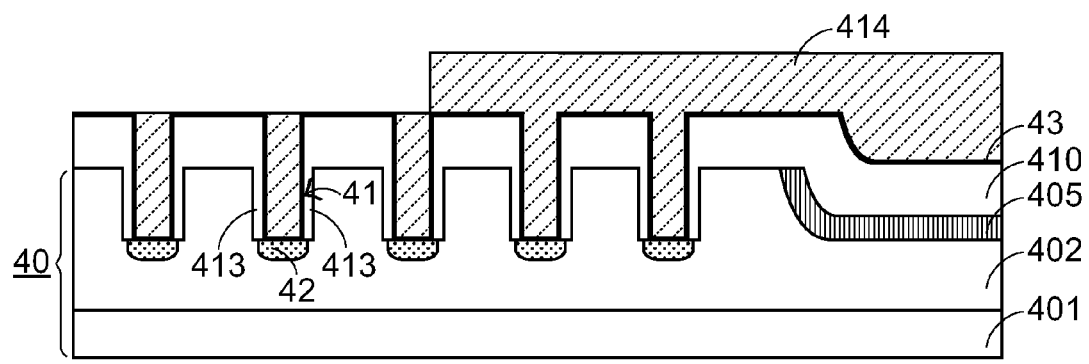
Figure 7H:
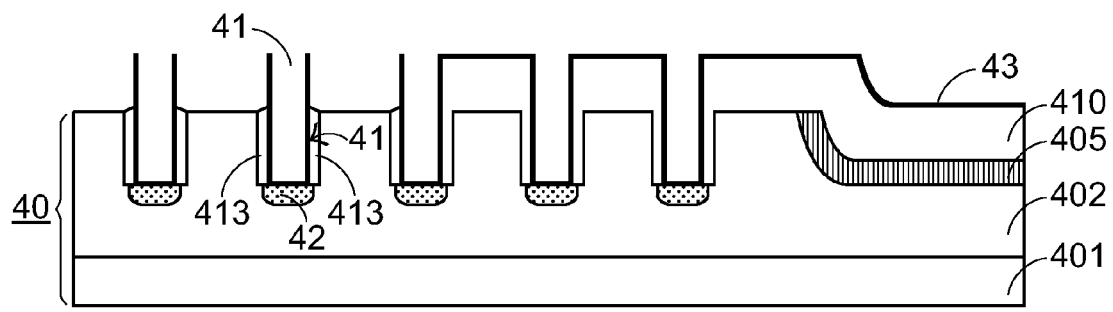

In FIG. 7G, a hard mask layer 43, for example a silicon nitride layer, is formed by a CVD procedure to cover the structure of FIG. 7F. A third patterned photoresist layer 414 for defining device area of the trench Schottky rectifier device 4 is formed on the hard mask layer 43 and in the trenches 41. Then, the uncovered hard mask layer 43 and the underlying mask oxide layer 410 are dry-etched off to expose the top surface of the epitaxial layer 402 at the device area. FIG. 7H shows the obtained structure in which the third patterned photoresist layer 314 has been stripped off.

Figure 7I:
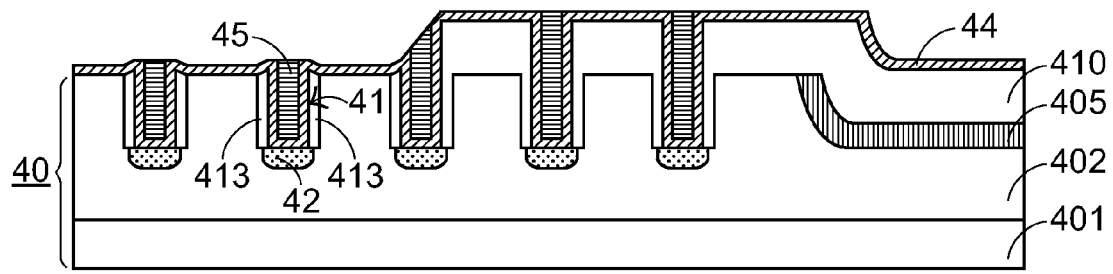

In FIG. 7I, the remaining hard mask layer 43 is removed, and an adhesion layer 44 made of Ti or TiN is optionally formed on the surfaces of the oxide layers 410 and 413 by a sputtering process to enhance the bonding of the electrode 46 to the epitaxial layer 402 and the oxide layers 410. The adhesion layer 44 may be subjected to a rapid thermal nitridation (RTN) process to enhance the bonding effect. Subsequently, the trenches 41 are filled with metal structure 45, for example, formed by a CVD procedure along with an etch-back procedure.

Figure 7J:
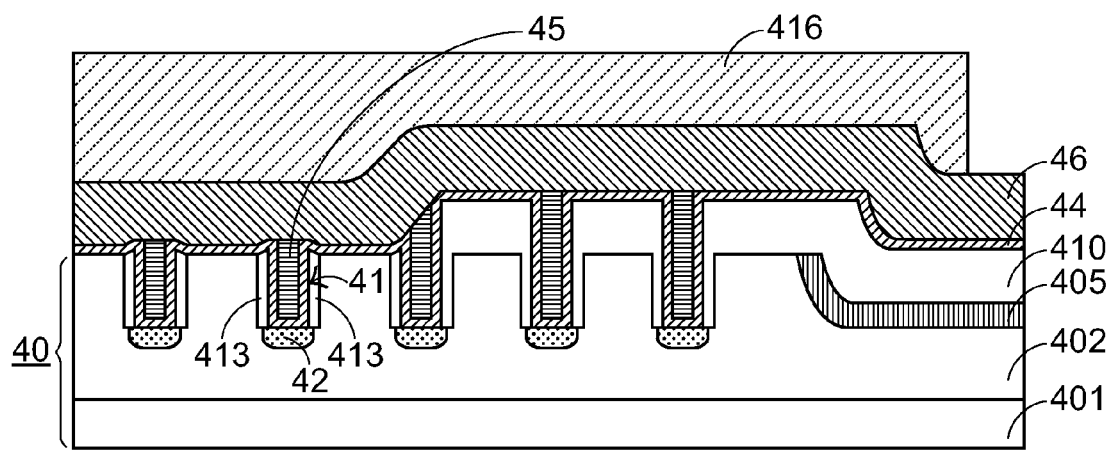

At last, the electrode 46 is formed on the resulting structure, as shown in FIG. 7J. In an embodiment, a metal sputtering procedure is performed on the structure of FIG. 7I to form the metal layer 46 overlying the adhesion layer 44 and the metal structure 45. In an embodiment, the metal layer 46 is made of Al or Al alloy. A rapid thermal processing (RTP) step can be performed to correct the defects resulting from the metal sputtering procedure. Then, a fourth patterned photoresist layer 416 is formed over the metal layer 46 to define the electrode 46. The resultant structure of the trench Schottky rectifier device 4 has been described with reference to FIG. 6.

According to the present invention, the trench Schottky rectifier device has low forward voltage drop and rapid switching speed in the forward bias mode. Furthermore, better than the conventional Schottky rectifier device, the Schottky rectifier device according to the present invention has low reverse leakage current in the reverse bias mode due to the pinch off effect as described above. The embedded doped regions 22, 32 and 42 do not reduce the effective area of the Schottky contacts because they are located under the trenches 21, 31 and 41. Hence, the present invention overcome the problems of the prior arts and is highly competitive.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a trench Schottky rectifier device, comprising steps of:
   providing a substrate having a first conductivity type;
   forming a mask oxide layer on the substrate and forming a plurality of openings in the mask oxide layer;
   forming a first plurality of trenches and a second plurality of trenches in the substrate according to the plurality of openings in the mask oxide layer;
   forming a plurality of doped regions having a second conductivity type in the substrate under the first plurality of trenches and the second plurality of trenches;
   forming an insulating layer on sidewalls of the first plurality of trenches and the second plurality of trenches;
   filling the first plurality of trenches with a first plurality of conductive structures and filling the second plurality of trenches with a second plurality of conductive structures;
   forming a first oxide layer covering on a first portion of the mask oxide layer and the first plurality of conductive structures;
   removing a second portion of the mask oxide layer to expose the second plurality of conductive structures and a first portion of the substrate;
   forming an electrode overlying the first oxide layer, the second plurality of conductive structures and the first portion of the substrate, wherein a Schottky contact forms between the electrode and the first portion of the substrate;
   forming a patterned photoresist layer over the electrode;
   etching off portions of the electrode and an adhesion layer according to the patterned photoresist layer;
   removing the patterned photoresist layer; and
   wherein the adhesion layer disposed between the first oxide layer and the electrode on the first portion of the substrate and disposed between the electrode and the second plurality of conductive structures on the second portion of the substrate.

2. The method according to claim 1 wherein before the step of forming the insulating layer on sidewalls of the first plurality of trenches and the second plurality of trenches, the method further comprises steps of:
   forming a sacrificial layer on the sidewalls of the first plurality of trenches and the second plurality of trenches; and
   removing the sacrificial layer to smooth the sidewalls of the first plurality of trenches and the second plurality of trenches.

3. The method according to claim 1 wherein the substrate comprises a relatively heavily-doped N-type silicon layer and a relatively lightly-doped N-type epitaxial layer.

4. The method according to claim 1 wherein the step of forming the plurality of doped regions further comprising a step of doping the substrate with P-type dopants through bottoms of the first plurality of trenches and the second plurality of trenches to form the doped regions.

5. The method according to claim 1 wherein the first plurality of conductive structures and the second plurality of conductive structures are polysilicon structures and the step of forming the first plurality of conductive structures and the second plurality of conductive structures comprises steps of:
   forming a polysilicon layer covering the substrate by a chemical vapor deposition procedure; and
   performing an etch-back procedure to remove a portion of the polysilicon layer out of the first plurality of trenches and the second plurality of trenches.

6. The method according to claim 1 wherein the step of forming the electrode further comprising steps of:
   forming the adhesion layer made of titanium or titanium nitride on the first oxide layer, the second plurality of conductive structures and the first portion of the substrate by a sputtering process; sintering the adhesion layer;
   forming a metal layer made of aluminum or aluminum alloy on the adhesion layer by another sputtering process; and
   sintering the metal layer.

* * * * *